(12) United States Patent
Kempen

(10) Patent No.: US 7,667,820 B2
(45) Date of Patent: Feb. 23, 2010

(54) METHOD FOR CHEMICAL REDUCTION OF AN OXIDIZED CONTAMINATION MATERIAL, OR REDUCING OXIDATION OF A CONTAMINATION MATERIAL AND A CONDITIONING SYSTEM FOR DOING THE SAME

(75) Inventor: Antonius Theodorus Wilhelmus Kempen, Den Bosch (NL)

(73) Assignee: ASML Netherlands B.V., Veldhoven (NL)

( * ) Notice: Subject to any disclaimer, the term of this patent is extended or adjusted under 35 U.S.C. 154(b) by 367 days.

(21) Appl. No.: 11/332,481

(22) Filed: Jan. 17, 2006

(65) Prior Publication Data

US 2007/0166215 A1 Jul. 19, 2007

(51) Int. Cl.
*G03B 27/52* (2006.01)
(52) U.S. Cl. .............................. 355/30; 355/53; 355/67; 355/77; 216/58; 216/76
(58) Field of Classification Search .................... 355/30, 355/53, 67; 216/58, 76; 438/905
See application file for complete search history.

(56) References Cited

U.S. PATENT DOCUMENTS 4,987,008 A   1/1991  Yamazaki et al. .......... 427/53.1

2004/0108473 A1   6/2004  Melnychuk et al. ......... 250/504
2004/0165160 A1   8/2004  Van Beek et al. ............. 355/30

FOREIGN PATENT DOCUMENTS

EP    1 536 458 A1   6/2005
EP    1 643 310 A1   4/2006

OTHER PUBLICATIONS

Silberberg, Martin S., Chemistry:the molecular nature of matter and change, 2003, McGraw-Hill, 3$^{rd}$ ed., pp. 736-741.*
International Search Report issued for PCT Patent Application No. PCT/NL2007/050018, dated Jul. 18, 2007.

* cited by examiner

*Primary Examiner*—Edward J Glick
*Assistant Examiner*—Steven H Whitesell-Gordon
(74) *Attorney, Agent, or Firm*—Pillsbury Winthrop Shaw Pittman LLP

(57) ABSTRACT

An amount of oxides in an apparatus having a chamber containing an amount of contamination material and an amount of the oxides, the oxides being oxides of the contamination material, is reduced. In the method, a hydrogen containing gas is provided in at least part of the chamber. A predetermined minimum partial hydrogen gas pressure and a predetermined maximum partial oxidants pressure is established in the chamber. In the chamber, a temperature is maintained which is at least higher than a temperature at which, in thermodynamic equilibrium given the predetermined maximum partial oxidants and minimum partial hydrogen gas pressures as established, the amount of contamination material is at least 10 times higher than the amount of oxides.

12 Claims, 7 Drawing Sheets

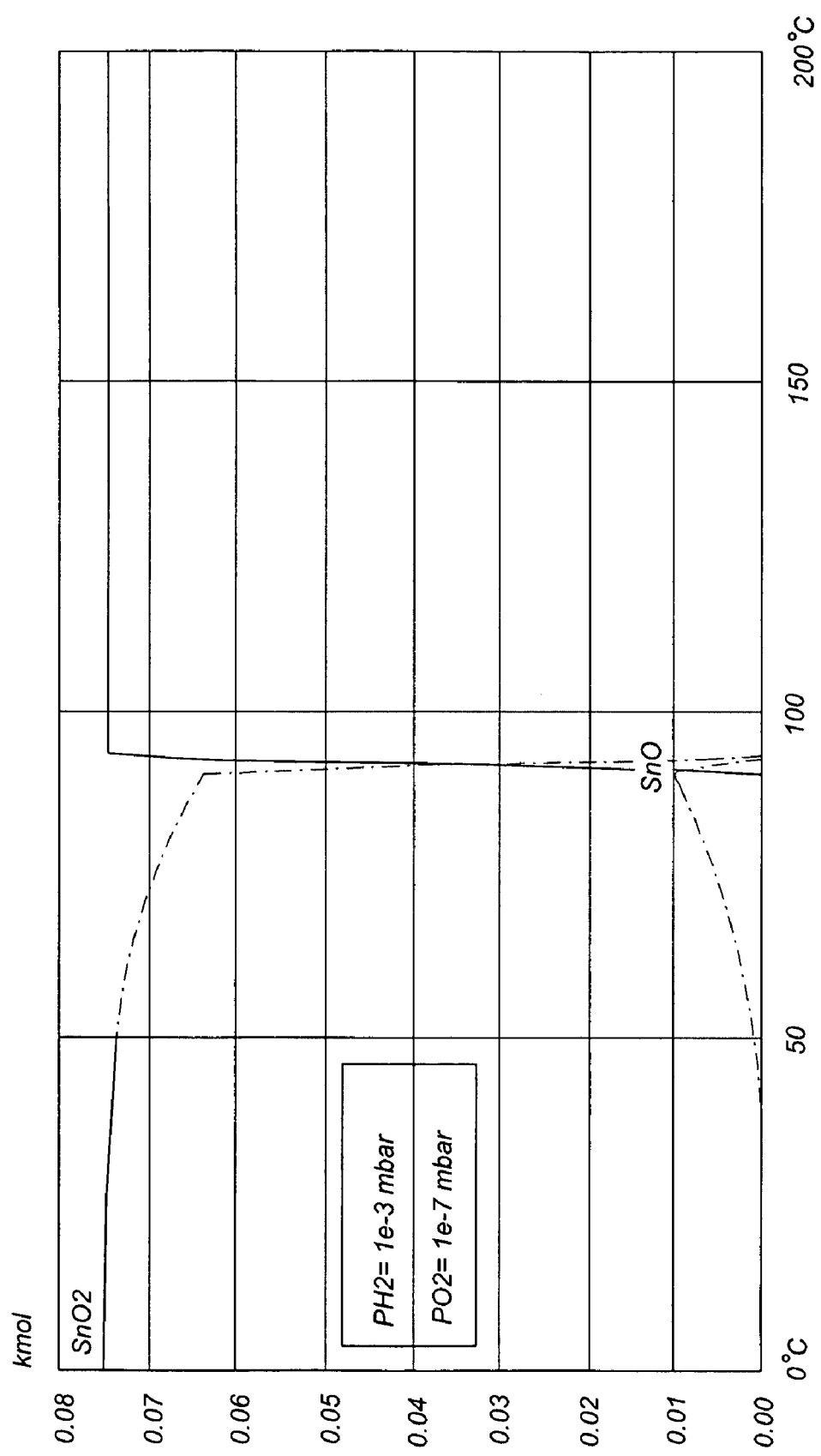

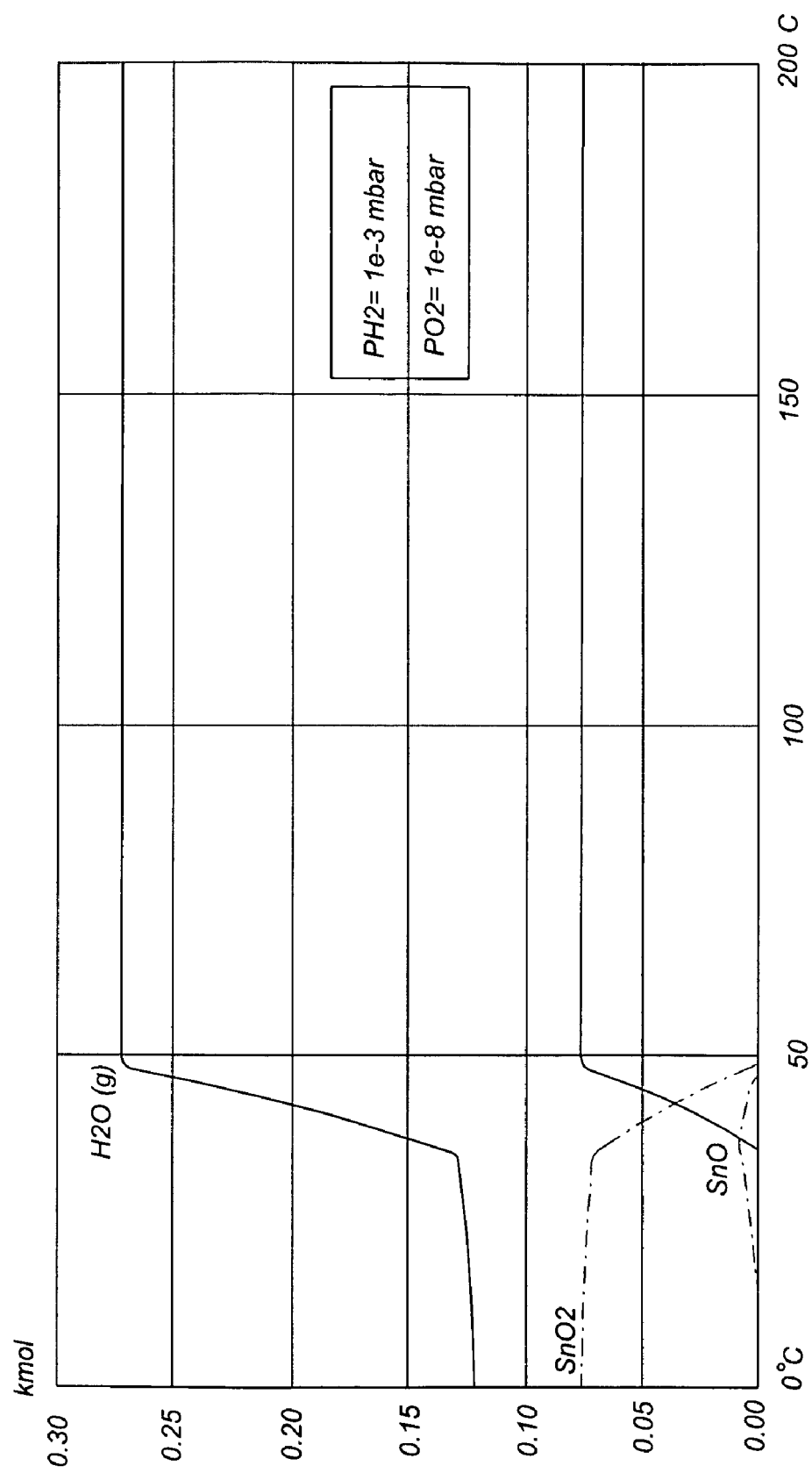

US 7,667,820 B2

METHOD FOR CHEMICAL REDUCTION OF AN OXIDIZED CONTAMINATION MATERIAL, OR REDUCING OXIDATION OF A CONTAMINATION MATERIAL AND A CONDITIONING SYSTEM FOR DOING THE SAME

BACKGROUND OF THE INVENTION

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus the size of features that can be imaged onto the substrate is limited by the wavelength of the radiation beam. To produce integrated circuits with a higher density of devices, and hence higher operating speeds, it is desirable to be able to image smaller features. While most current lithographic projection apparatus employ ultraviolet light generated by mercury lamps or excimer laser, it has been proposed to use shorter wavelength radiation, e.g. of around 13 nm. Such radiation is termed extreme ultraviolet (EUV) or soft x-ray, and possible sources include, for example, laser-produced plasma sources, discharge plasma source or synchrotron radiation from electron storage rings.

In the near future, EUV sources may use tin or another metal vapor to produce EUV radiation. This tin may leak into other parts of the lithographic apparatus and will be deposited on optical elements, for example mirrors, either as tin or after oxidation as a tin oxide.

SUMMARY OF THE INVENTION

It is desirable to provide a method of reducing an amount of oxides in a gas mixture in an apparatus.

The invention provides a method of reducing an amount of oxides in an apparatus, the apparatus including a chamber containing an amount of contamination material and an amount of the oxides, the oxides being oxides of the contamination material, the method including providing a hydrogen containing gas in at least part of the chamber; establishing a predetermined minimum partial hydrogen gas pressure in the at least part of the chamber; establishing a predetermined maximum partial oxidants gas pressure in the at least part of the chamber; maintaining a temperature in the at least part of the chamber such that the temperature as maintained is at least higher than a temperature at which, in thermodynamic equilibrium given the predetermined maximum partial oxidants and minimum partial hydrogen gas pressures as established, the amount of at least partially oxidized contamination material is at least 10 times higher than the amount of oxides.

The invention further relates to a device manufacturing method including projecting a patterned beam of radiation onto substrate, wherein the method includes providing a lithographic apparatus including a radiation source, an illumination system and a projection system; providing a beam of radiation using the illumination system; patterning a beam in its cross section to provide the patterned beam of radiation, wherein during use of the lithographic apparatus an environment within the illumination system is controlled by a method according to the present invention.

The invention further relates to a computer program product including data and instructions to be loaded by a processor of a lithographic apparatus, and configured to allow the lithographic apparatus to perform a method according the present invention in the lithographic apparatus.

The invention further relates to a conditioning system for reducing an amount of oxides, including a chamber and a control unit, the chamber containing an amount of contamination material and an amount of the oxides, the oxides being oxides of the contamination material, the chamber including an inlet configured to provide a hydrogen containing gas in at least part of the chamber; an element to be cleaned, located in the at least part of the chamber; a temperature measurement device configured to measure a temperature in the at least part of the chamber; a heating element for heating the element to be cleaned, wherein the control unit is configured to control activation of the heating element so as to maintain a temperature in the chamber, which is at least higher than a temperature at which, in thermodynamic equilibrium given a partial oxidants gas pressure and given the partial hydrogen gas pressure as let in, the amount of contamination material is at least 10 times higher than the amount of oxides.

The invention further relates to a lithographic apparatus including an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein the illumination system includes aforementioned conditioning system.

The invention further relates to a semiconductor device manufactured method including transferring a pattern from a patterning device onto a substrate using a lithographic apparatus.

The invention further relates to a method of removing a deposition of a contamination material on an element provided in a chamber of an apparatus, the chamber containing an amount of the contamination material and an amount of the oxides, the oxides being oxides of the contamination material, the method including providing a hydrogen containing gas in at least part of the chamber; establishing a predetermined minimum partial hydrogen gas pressure in the least part of the chamber; establishing a predetermined maximum partial oxidants gas pressure in the at least part of the chamber; maintaining a temperature in the at least part of the chamber such that the temperature as maintained is at least higher than a temperature at which, in thermodynamic equilibrium given the predetermined partial oxidants and partial hydrogen gas pressures as established, the amount of contamination material is at least 10 times higher than the amount of oxides; providing a halogen containing gas for removing at least part of the deposition on the element.

The invention further relates to a method of reducing an amount of tin oxides in a gas mixture in a lithographic apparatus, the lithographic apparatus including a chamber containing the gas mixture, the gas mixture containing an amount of tin material and an amount of the tin oxides, the method including providing hydrogen gas in at least part of the chamber; establishing a predetermined minimum partial hydrogen gas pressure in the at least part of the chamber; establishing a predetermined maximum partial oxidants gas pressure in the at least part of the chamber; maintaining a temperature in the at least part of the chamber such that the temperature as maintained is at least higher than a temperature at which, in thermodynamic equilibrium given the predetermined partial oxidants and partial hydrogen gas pressures as established, the amount of tin material is at least 10 times higher than the amount of tin oxides.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4a-d depict four simulation graphs showing available amounts of tin and tin oxides as a function of temperature for different partial gas pressures of hydrogen and oxygen.

DETAILED DESCRIPTION

Figure 1:
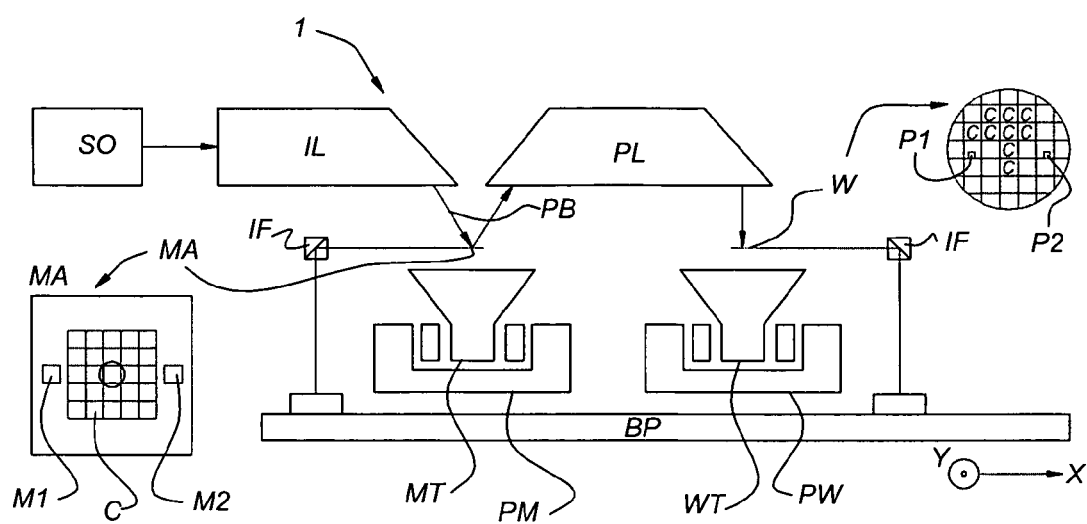
FIG. 1 schematically depicts a lithographic apparatus according to an embodiment of the invention.

FIG. 1 schematically depicts a lithographic apparatus 1 according to an embodiment of the invention. The apparatus 1 includes an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PL is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the context of this description, "optical element" includes one or more elements selected from optical filters, optical gratings, mirrors such as multilayer mirrors, grazing incidence mirrors, normal incidence mirrors, collector mirrors etc., lenses, reticles, diodes, sensors such as intensity measurement sensors, energy sensors, CCD sensors, alignment sensors such as optical alignment sensors, and debris mitigation systems such as gas barriers and foiltraps.

Such optical elements may be flat or curved and may be present as layer, foil, device etc. In embodiments of the present invention such optical elements may be blazed or designed for radiation with a predetermined wavelength (like 5-20 nm EUV radiation, 248 nm, 193 nm, 157 nm, 126 nm etc.). They may also be transmissive to radiation with wavelengths $\lambda$ in the case of lenses, or reflective in the case of mirrors, or diffractive in the case of gratings. Some optical elements may provide one or more of these optical effects.

As should be appreciated by those of ordinary skill in the art, radiation having a wavelength in the range of 5-20 nm relates to radiation with a certain wavelength band width, of which at least part of it is found in the range of 5-20 nm.

In the context of this description, "reducing oxides" includes at least one of preventing a formation of oxides and chemical reduction of oxides to the non oxidic state. This can be done both in for oxides in a gaseous phase, and also for oxides in a solid state phase and liquid state phase.

In the context of this description, "oxidant" includes material including oxygen including oxygen ($O_2$), water ($H_2O$), carbon dioxide ($CO_2$) and carbon monoxide (CO).

Figure 2:
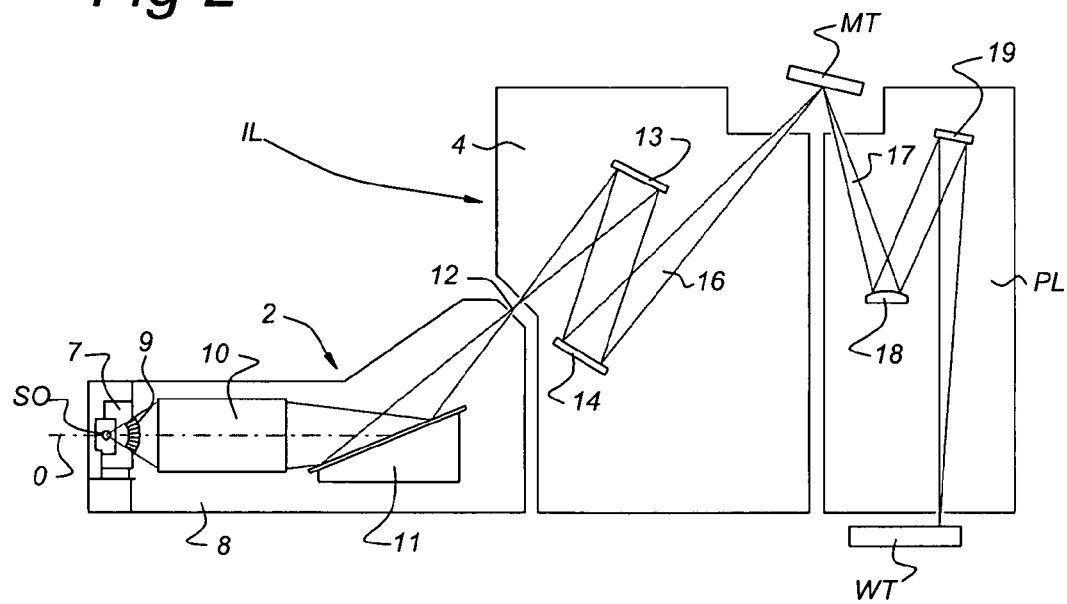
FIG. 2 schematically depicts aspects of the lithographic apparatus of FIG. 1 in more detail.

FIG. 2 shows aspects of the lithographic apparatus 1 in more detail, including a radiation system 2, an illumination optics unit 4, and the projection system PL. The radiation system 2 includes the radiation source SO, which may be formed by a discharge plasma. EUV-radiation may be produced by a gas or vapor, such as Xe-gas, Li-vapor or Sn-vapor in which a very hot plasma is created to emit radiation in the EUV range of the electromagnetic spectrum. The very hot plasma is created by causing a partially ionized plasma of an electrical discharge to collapse onto an optical axis O. Partial pressures of 10 Pa of Xe, Li, Sn vapor or any other suitable gas or vapor may be required for efficient generation of the radiation. The radiation emitted by radiation source SO is passed from a source chamber 7 into a collector chamber 8 via a gas barrier or contamination trap 9, which is positioned in or behind an opening in source chamber 7. The gas barrier/contamination trap 9 includes a channel.

The collector chamber 8 includes a radiation collector 10 which may be formed by a grazing incidence collector. Radiation passed by collector 10 is reflected off a grating spectral filter 11 to be focused in a virtual source point 12 at an aperture in the collector chamber 8. From collector chamber 8, a radiation beam 16 is reflected in illumination optics unit 4 via normal incidence reflectors 13, 14 onto a reticle or mask positioned on reticle or mask table MT. A patterned beam 17 is formed which is imaged in projection system PL, via reflective elements 18, 19 onto substrate table WT. More elements than shown may generally be present in illumination optics unit 4 and projection system PL.

As mentioned above, EUV sources may use tin (Sn) vapor to produce EUV radiation. The tin may leak into the lithographic apparatus and will be deposited on optical elements in the lithographic apparatus, e.g., the mirrors of the radiation collector, the foiltrap, etc. The mirrors of such a radiation collector may have an EUV reflecting top layer of ruthenium (Ru). Deposited layers of more than approximately 10 nm tin on the reflecting Ru layer will reflect EUV radiation in the same way as bulk tin. Near a tin based EUV source, such a layer is deposited within a limited amount of time. Therefore, the radiation collector needs to be cleaned regularly.

It is found that the deposited tin-layer does not include solely pure tin (Sn). A large fraction of the layer includes tin oxides like SnO and $SnO_2$. Sn may be cleaned by using an iodine gas, however this is not sufficient to remove the oxidic Sn. Oxidic Sn therefore has to be reduced prior to cleaning with iodine gas. Chemical reduction processes can be thought of that give rise to extremely harsh conditions on materials. For instance, the radiation collector 50 may degrade in such a process.

Figure 3:
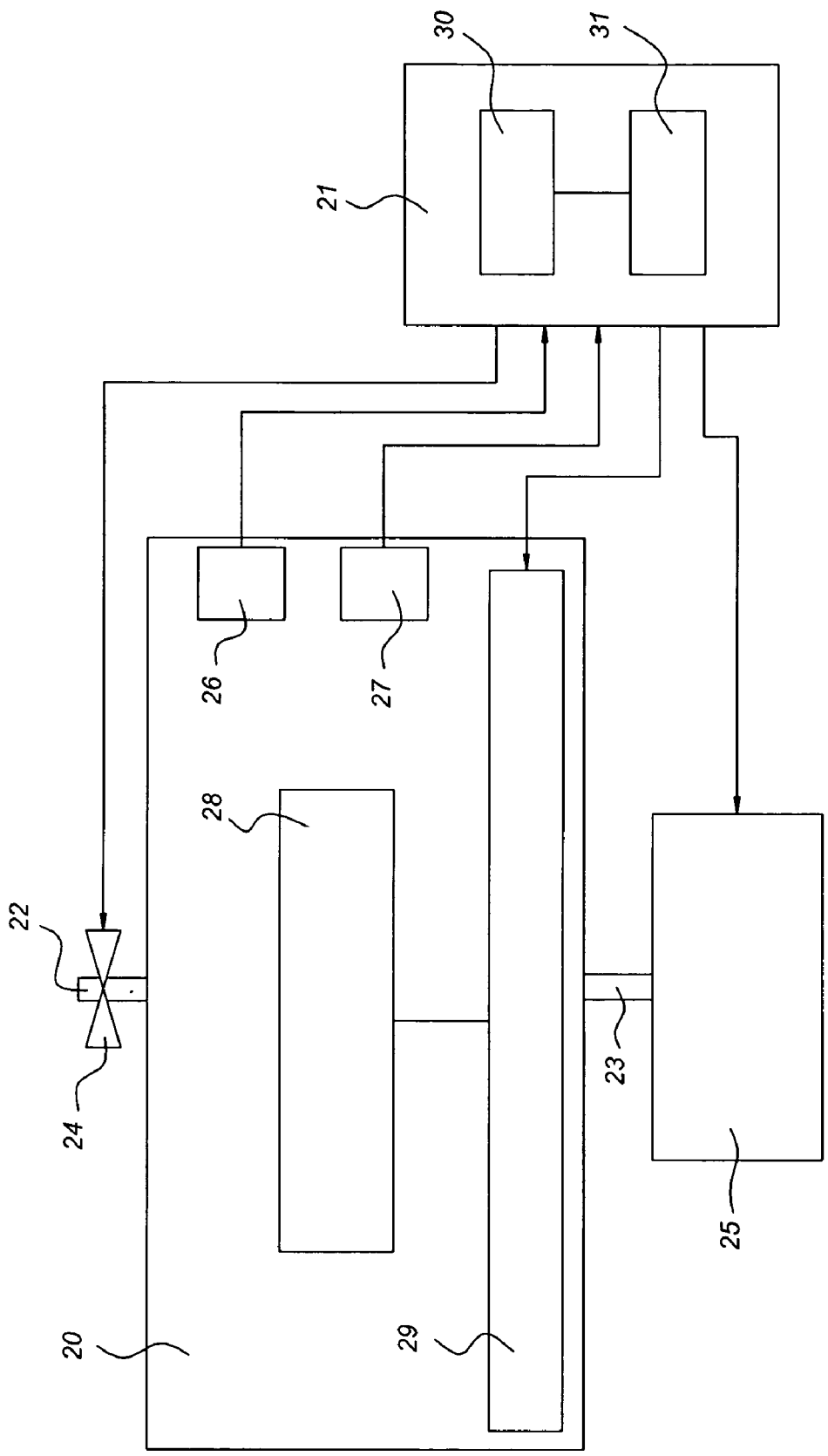
FIG. 3 schematically depicts a conditioning system according to an embodiment of the invention.

FIG. 3 schematically shows a conditioning system according to an embodiment of the invention. The conditioning system is used to reduce an amount of oxides, including oxides of a contamination material, to its non-oxidic state, in an apparatus. The conditioning system includes a chamber 20 and a control unit 21. The chamber 20, in which aforementioned reduction is to be achieved, is provided with an inlet 22 and an outlet 23. The inlet 22 is configured to provide gases in at least part of the chamber 20. In an embodiment a $H_2$ containing gas is provided, however also other gases like oxidants ($O_2$, $H_2O$, $CO_2$, CO etc.) or argon (Ar) may be provided/present in at least part of the chamber 20 through inlet 22. The cross section of the inlet 22 may be adjustable by using an adjustment device 24, e.g. a valve. Alternatively, the inlet 22 may be provided with a chemical filter to filter the gas provided there through. By adjustment of the cross section of the inlet 22 or filtering the gas provided there through with a chemical filter, ratios between partial pressures of different gases, for instance a hydrogen/oxidants partial pressure ratio, may be altered. The outlet 23 may be connected to a pump 25 for the same purpose.

The chamber includes an optical element 28, e.g. collector 10, connected to a heating element 29 for heating the optical element 28 and/or the chamber 20 and parts thereof. In FIG. 3, the heating element 29 is drawn inside the chamber 20 adjacent to the optical element 28. It should be appreciated that the heating element 29 may also be provided at an edge of the chamber 20 or integrated in the optical element 28.

The chamber 20 may furthermore be provided with a temperature measurement device 26 and/or a partial gas pressure measurement device 27. Such a temperature measurement device 26 is configured to measure the temperature in the chamber 20 or parts thereof. The partial gas pressure measurement device 27 is configured to measure partial gas pressures in the chamber 20 or parts thereof, e.g. partial gas pressures of hydrogen, oxidants and argon.

In FIG. 3, a single temperature measurement device 26, partial gas pressure measurement device 27 and heating element 29 are drawn. It should be appreciated that in other embodiments, more than one of each of these components may be provided per chamber 20. Furthermore, chamber 20 may be provided with more than one inlet 22 and/or outlet 23.

The control unit 21 is configured to control activation of the heating element 29 to establish and maintain a certain temperature in chamber 20. The activation may be based on measurement signals received from the temperature measurement device 26. Furthermore, the control unit 21 may control activation of the adjustment device 24 and/or pump 25 as well as the heating element 29 based on measurement signals received from the partial gas pressure measurement device 27. In response to these measurement signals, the control unit 21 may send control signals to one or more of the adjustment device 24, pump 25 and heating element 29 to establish and/or maintain desired conditions regarding temperature and/or partial gas pressures in the chamber 20.

For aforementioned purposes, the control unit 21 may be provided with a processor 30 and a memory 31. In the memory 31 of the control unit 21, pre-specified information may be stored regarding temperatures and/or partial gas pressures. Controlled by software stored in memory 31, the processor 30 of the control unit 21 may be used to calculate control signals to be sent to one or more of the adjustment device 24, pump 25 and heating element 29 by using the measurement signals, received from the temperature measurement device 26 and the partial gas pressure measurement device 27, and the pre-specified information regarding temperatures and partial gas pressures, stored in the memory 31.

Examples of chambers 20 include collector chamber 8, illumination optics unit 4 and projection system PL.

In an embodiment, the control signals are not directly sent to one or more of the adjustment device 24, pump 25 and heating element 29, but to a display. In this case, an operator, who is responsible for the operation of the lithographic apparatus 1, may then be able to control supplying control signals to one or more of the adjustment device 24, pump 25 and heating element 29.

Through thermodynamic calculations (which have been confirmed by experiments), it turned out that a suitable environment with a minimized oxidation of material, e.g. oxidation of tin, is available when a temperature in a closed volume, e.g. collector 10, is higher than a temperature at which, in thermodynamic equilibrium given certain partial oxidants and partial hydrogen gas pressures, a certain material, e.g. tin, is mainly present as compared to oxides of this material, e.g. tin oxides. It turned out that this is the case when the temperature rises above a minimum temperature. At this minimum temperature the amount of contamination material is at least 10 times higher than the amount of oxides of this material.

A conditioning system according to embodiments of the invention, for instance the conditioning system schematically shown in FIG. 3, is configured to establish suitable partial gas pressures of hydrogen and oxidants, and all gas species leading to oxidation, e.g. $H_2O$, in chamber 20 to establish and maintain aforementioned minimum temperature. By establishing that a thermodynamic equilibrium between a contamination material and its oxides lies mainly at the material, i.e. the oxides are outnumbered by at least 1:10, an optical element 28 in the chamber 20, e.g. a collector 10, may be cleaned. Here cleaning is defined as the complete or partial removal of a deposition of aforementioned contamination material. Especially in the case of partial removal of the contamination material, the total cleaning process may be built-up of several subsequent (possibly identical) processes. In this case, processes may include chemical reduction of oxidized contamination material and/or removal of the contamination material.

Figure 4A:
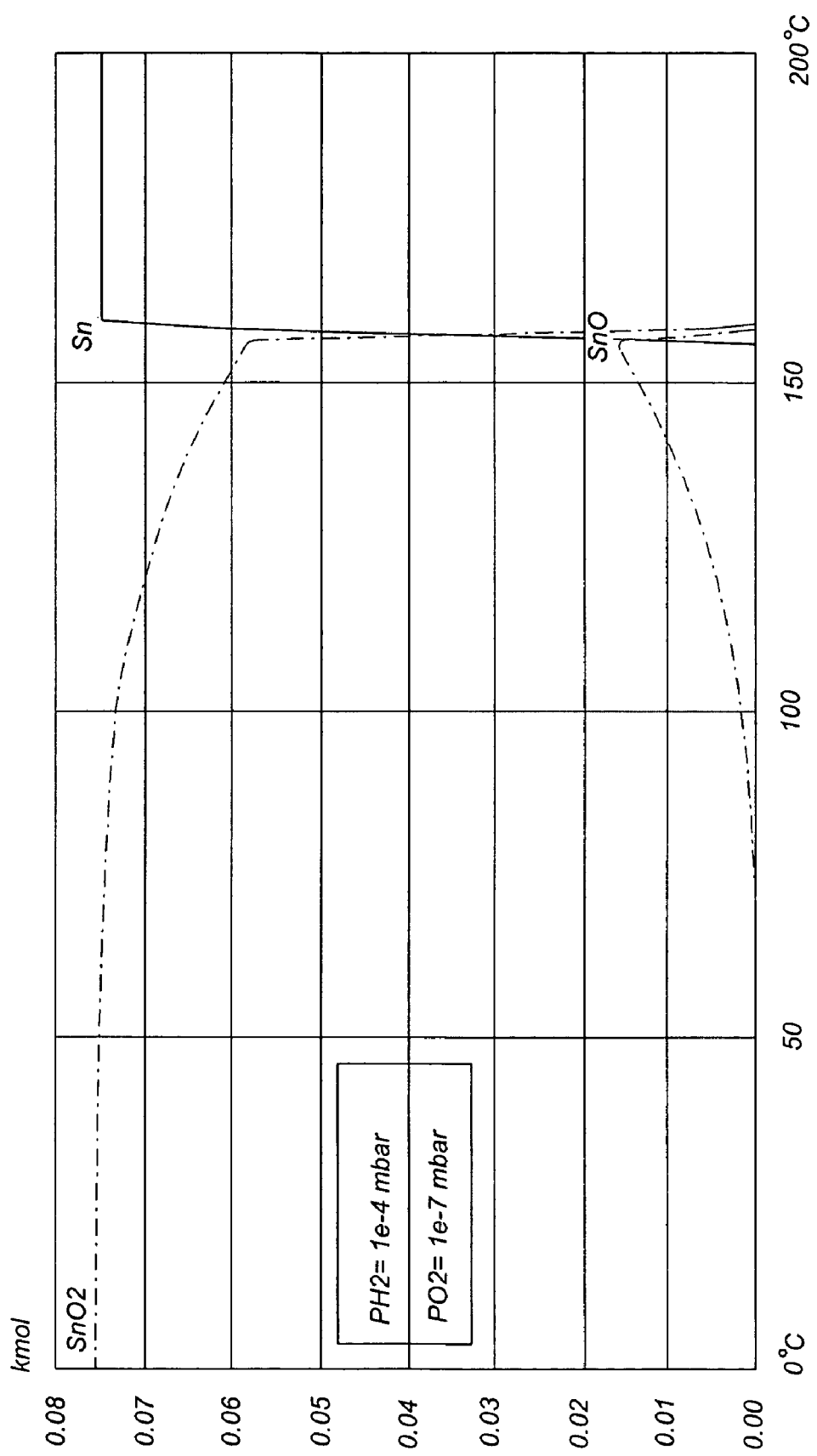
Figure 4C:
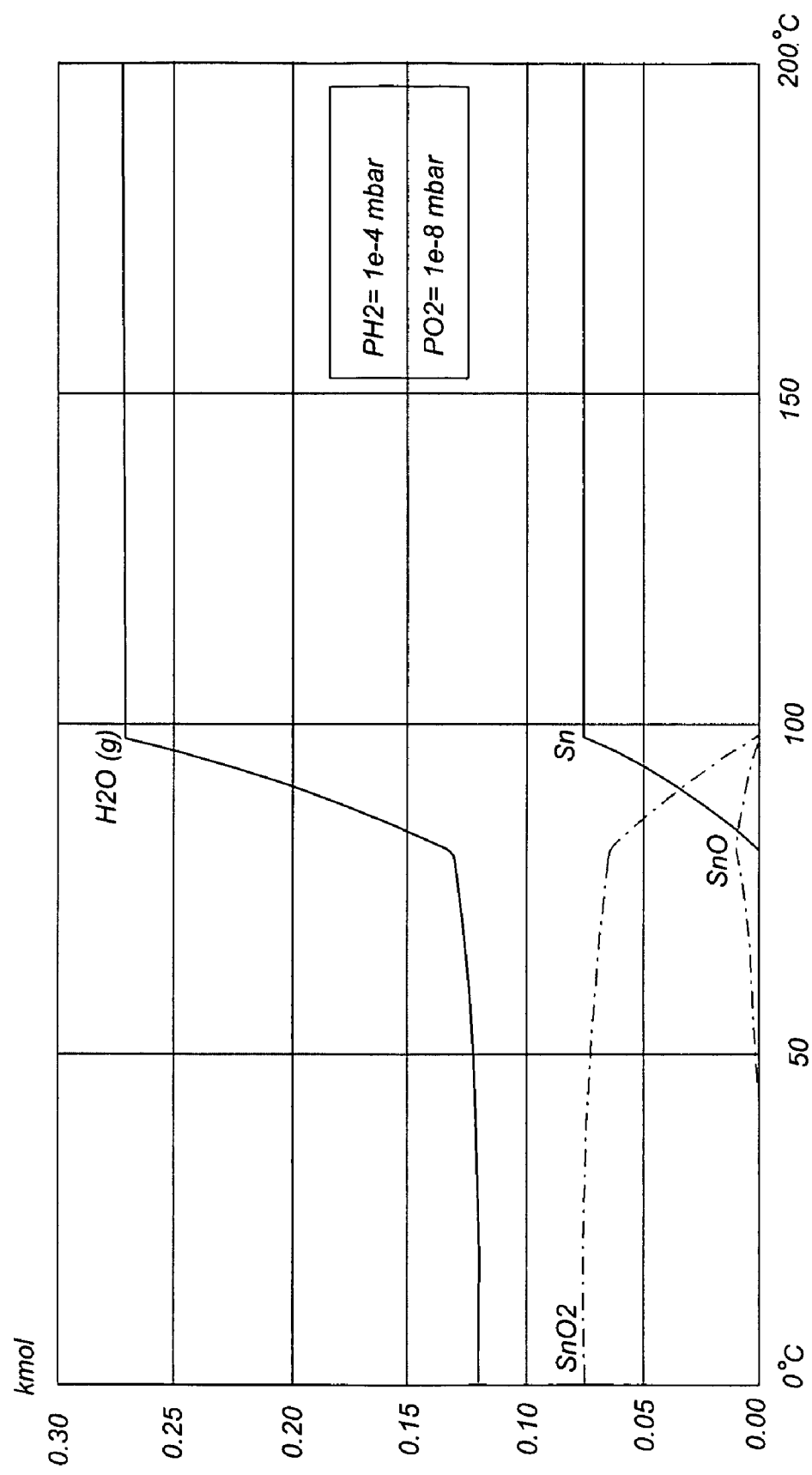

In FIGS. 4a-4d, four simulation graphs are depicted showing thermodynamically stable amounts of tin (Sn; solid line) and tin oxides (SnO and $SnO_2$; lower and upper dotted-dashed line respectively) in kmol as a function of temperature in degrees Celsius for different partial gas pressures of hydrogen and oxygen. In FIGS. 4a and 4b, the partial oxidant gas pressure, in this simulation only including oxygen gas, is $10^{-7}$ mbar. In FIG. 4a, the partial hydrogen pressure is $10^{-4}$ mbar, while in FIG. 4b the partial hydrogen pressure is taken to be $10^{-3}$ mbar. In FIGS. 4c and 4d, the partial oxidant gas pressure, in these simulations only including oxygen gas, is $10^{-8}$ mbar. In FIG. 4c, the partial hydrogen pressure is $10^{-4}$ mbar, while in FIG. 4d the partial hydrogen pressure is taken to be $10^{-3}$ mbar.

Table 1 presents minimum temperatures in degrees Celsius (° C.) for a minimum presence of tin oxides at specified oxidant/$H_2$ ratios.

TABLE 1

Minimum temperature (degrees Celsius) needed for minimum presence of tin oxides at specified oxidant/$H_2$ ratio.

| Oxidant/$H_2$ ratio | Temperature (° C.) |
| --- | --- |
| 1e−2 | ±250 |
| 1e−3 | ±160 |
| 1e−4 | ±90 |
| 1e−5 | ±50 |
| 1e−6 | ±10 |

Figure 5:
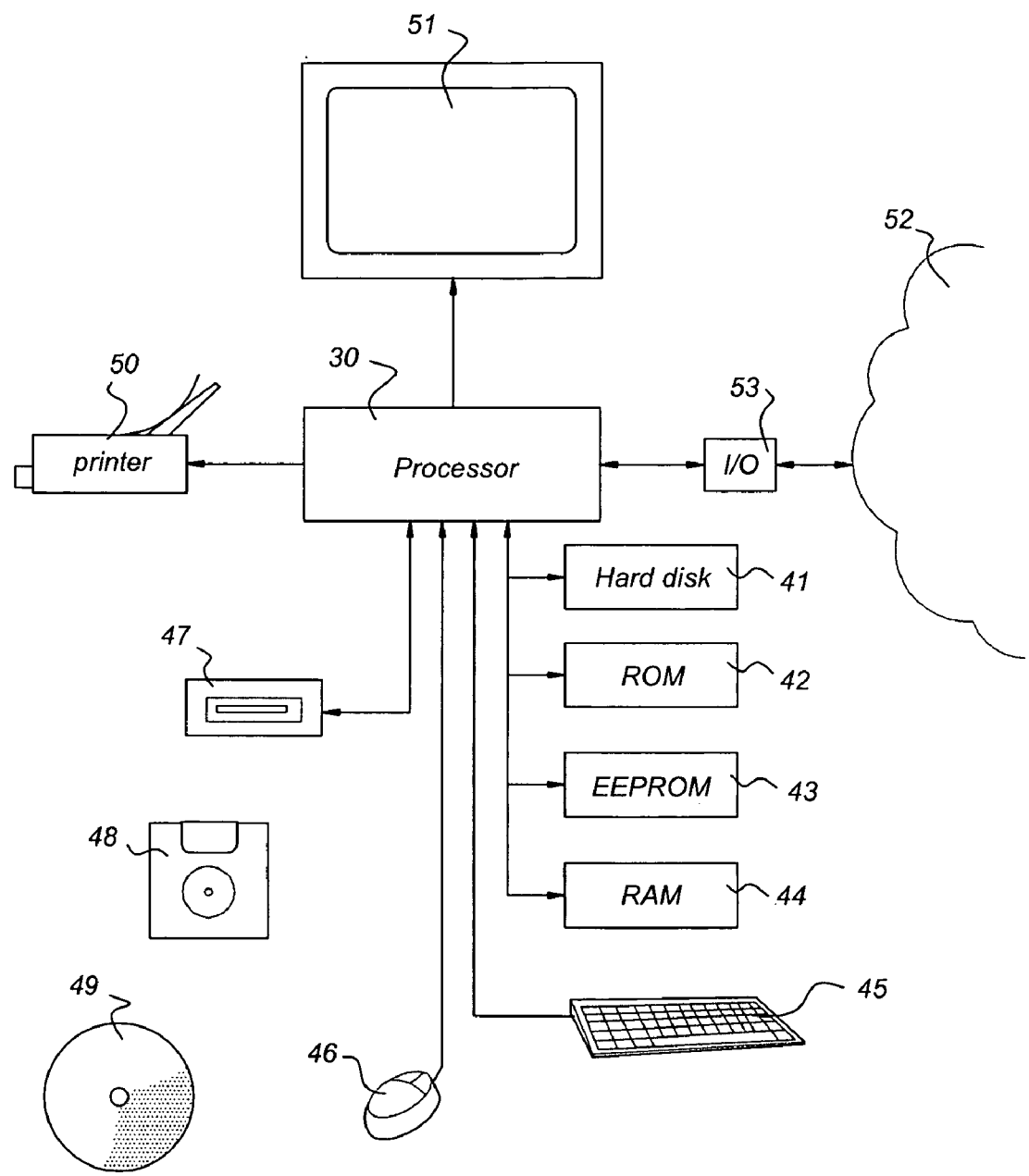
FIG. 5 schematically depicts a computer including a processor as used in embodiments of the invention.

From aforementioned thermodynamic calculations, it turned out that good results can be obtained when the partial oxidants gas pressure is at least about 100 times lower than the partial hydrogen pressure. In an embodiment, the partial oxidants pressure is selected from a range of $10^{-8}$-$10^{-1}$ bar and the partial hydrogen gas pressure is selected from a range of $10^{-4}$-$10^{1}$ bar. A similar conditioning system may be used to accommodate a method to remove a deposition of a contamination material on an element, i.e. an optical element, provided in chamber 20. In this method, after providing a hydrogen containing gas in at least part of the chamber, establishing a predetermined minimum partial hydrogen gas pressure and a maximum partial oxidants gas pressure in that part of the chamber, and furthermore maintaining a temperature in that part of the chamber that is higher than a temperature at which, in equilibrium, given the predetermined minimum partial hydrogen gas pressure and the maximum partial oxidants gas pressure, the amount of contamination material is at least 10 times higher than an amount of oxides of the contamination material, a halogen containing gas is added to the chamber 20 to remove at least part of the deposition on the element. In an embodiment, the halogen containing gas includes a iodine containing gas. The halogen containing gas may be provided simultaneously with the hydrogen containing gas. It is also possible that alternatingly hydrogen containing gas and halogen containing gas are provided in the chamber 20, a number of times, e.g. 3 or 5, providing a halogen containing gas for several minutes, providing a hydrogen containing gas for several minutes, providing a halogen containing gas for several minutes etc. It should be appreciated that processor 30 as used throughout this text can be implemented in a computer assembly 40 as shown in FIG. 5. The memory 31 may include a number of memory components, for example a hard disk 41, read only memory (ROM) 42, electrically erasable programmable read only memory (EEPROM) 43, and/or random access memory (RAM) 44. Not all aforementioned memory components need to be present. Furthermore, the memory components are physically need not be in close proximity to the processor 30 or to each other. They may be located at a distance away.

The processor 30 may also be connected to a user interface, for example a keyboard 45 and/or a mouse 46. A touch screen, track ball, speech converter or other interfaces may also be used.

The processor 30 may be connected to a reading unit 47, which is configured to read data from and under some circumstances store data on a data carrier, for example a floppy disc 48 or a CDROM 49. Also DVD's or other data carriers may be used.

The processor 30 may also be connected to a printer 50 to print out output data on paper as well as to a display 51, for example a monitor or liquid crystal display (LCD), of any other type of display.

The processor 30 may be connected to a communications network 52, for instance a public switched telephone network (PSTN), a local area network (LAN), a wide area network (WAN) etc. by a transmitters/receivers 53 responsible for input/output (I/O). The processor 30 may be configured to communicate with other communication systems via the communications network 52. In an embodiment of the invention external computers (not shown), for instance personal computers of operators, can log into the processor 30 via the communications network 52.

The processor 30 may be implemented as an independent system or as a number of processing units that operate in parallel, wherein each processing unit is configured to execute sub-tasks of a larger program. The processing units may also be divided in one or more main processing units with several subprocessing units. Some processing units of the processor 30 may even be located a distance away of the other processing units and communicate via communications network 52.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may have been made above to the use of embodiments of the invention to compensate for cooling caused by evaporation of an immersion liquid in an immersion lithographic apparatus, it should be appreciated that several embodiments of the invention may also be used to compensate for thermally induced deformation that are caused by heating of the substrate due to radiation in a conventional optical lithographic apparatus, i.e. an optical lithographic apparatus without the presence of an immersion liquid.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of reducing an amount of oxides in an apparatus, the apparatus comprising a chamber containing an amount of contamination material and an amount of the oxides, the oxides being oxides of the contamination material, the method comprising:
   providing a hydrogen containing gas in at least part of the chamber;
   establishing a predetermined minimum partial hydrogen gas pressure in the at least part of the chamber;
   establishing a predetermined maximum partial oxidants gas pressure in the at least part of the chamber; and
   maintaining a temperature in the at least part of the chamber such that the temperature as maintained is at least higher than a temperature at which, in thermodynamic equilibrium given the predetermined maximum partial oxidants and minimum partial hydrogen gas pressures as established, the amount of contamination material is at least 10 times higher than the amount of oxides.

2. A method according to claim 1, wherein the partial oxidants gas pressure as established is at least about 100 times lower than the partial hydrogen pressure as established.

3. A method according to claim 1, wherein the partial oxidant gas pressure is selected from a range of $10^{-8}$-$10^{-1}$ bar and the partial hydrogen gas pressure is selected from a range of $10^{-4}$-$10^{1}$ bar.

4. A device manufacturing method for manufacturing a device in a lithographic apparatus, the lithographic apparatus comprising a chamber containing an amount of contamination material and an amount of the oxides, the oxides being oxides of the contamination material, the method comprising:
   providing a hydrogen containing gas in at least part of the chamber;
   establishing a predetermined minimum partial hydrogen gas pressure in the at least part of the chamber;
   establishing a predetermined maximum partial oxidants gas pressure in the at least part of the chamber;
   maintaining a temperature in the at least part of the chamber such that the temperature as maintained is at least higher than a temperature at which, in thermodynamic equilibrium given the predetermined maximum partial oxidants and minimum partial hydrogen gas pressures as established, the amount of contamination material is at least 10 times higher than the amount of oxides; and
   projecting a patterned beam of radiation onto a substrate at least partially covered by a layer of radiation sensitive material.

5. A method of removing a deposition of a contamination material on an element provided in a chamber of an apparatus, the chamber containing an amount of the contamination material and an amount of the oxides, the oxides being oxides of the contamination material, the method comprising:
   providing a hydrogen containing gas in at least part of the chamber;
   establishing a predetermined minimum partial hydrogen gas pressure in the least part of the chamber;
   establishing a predetermined maximum partial oxidants gas pressure in the at least part of the chamber;
   maintaining a temperature in the at least part of the chamber such that the temperature as maintained is at least higher than a temperature at which, in thermodynamic equilibrium given the predetermined partial oxidants and partial hydrogen gas pressures as established, the amount of contamination material is at least 10 times higher than the amount of oxides; and
   providing a halogen containing gas for removing at least part of the deposition on the element.

6. A method according to claim 5, wherein providing a hydrogen containing gas and providing a halogen containing gas are performed simultaneously.

7. A method according to claim 5, wherein the partial oxidants gas pressure as established is at least about 100 times lower than the partial hydrogen pressure as established.

8. A method according to claim 5, wherein the partial oxidants gas pressure is selected from a range of $10^{-8}$-$10^{-1}$ bar and the partial hydrogen gas pressure is selected from a range of $10^{-4}$-$10^{1}$ bar.

9. A method according to claim 5, wherein the halogen containing gas is a iodine containing gas.

10. A method of reducing an amount of tin oxides in a gas mixture in a lithographic apparatus, the lithographic apparatus comprising a chamber containing the gas mixture, the gas mixture containing an amount of tin material and an amount of the tin oxides, the method comprising:
   providing hydrogen gas in at least part of the chamber;
   establishing a predetermined minimum partial hydrogen gas pressure in the at least part of the chamber;
   establishing a predetermined maximum partial oxidants gas pressure in the at least part of the chamber; and
   maintaining a temperature in the at least part of the chamber such that the temperature as maintained is at least higher than a temperature at which, in thermodynamic equilibrium given the predetermined partial oxidants and partial hydrogen gas pressures as established, the amount of tin material is at least 10 times higher than the amount of tin oxides.

11. A method according to claim 10, wherein the partial oxidants gas pressure is selected a factor of at least about 100 times lower than the partial hydrogen pressure.

12. A method according to claim 10, wherein the partial oxidants gas pressure is selected from a range of $10^{-8}$-$10^{-1}$ bar and the partial hydrogen gas pressure is selected from a range of $10^{-4}$-$10^{1}$ bar.

* * * * *